(12) United States Patent
Sugahara

(10) Patent No.: US 7,877,668 B2
(45) Date of Patent: Jan. 25, 2011

(54) MEMORY ACCESS SYSTEM

(75) Inventor: Takahiko Sugahara, Osaka (JP)

(73) Assignee: MegaChips Corporation, Osaka-shi (JP)

( * ) Notice: Subject to any disclaimer, the term of this patent is extended or adjusted under 35 U.S.C. 154(b) by 315 days.

(21) Appl. No.: 12/115,098

(22) Filed: May 5, 2008

(65) Prior Publication Data

US 2008/0294949 A1  Nov. 27, 2008

(30) Foreign Application Priority Data

May 24, 2007  (JP) .............................. 2007-137475

(51) Int. Cl.
*G11C 29/00* (2006.01)

(52) U.S. Cl. .................. 714/764; 714/718; 714/799; 714/47; 714/5; 714/6; 714/52; 714/754; 714/2; 711/102; 365/148; 365/201; 365/222

(58) Field of Classification Search .................. None
See application file for complete search history.

(56) References Cited

U.S. PATENT DOCUMENTS 4,694,454 A * 9/1987 Matsuura ..................... 714/6

| 2005/0210184 | A1 |   | 9/2005 | Chen et al. |
|---|---|---|---|---|
| 2007/0011513 | A1 | * | 1/2007 | Biswas et al. ............... 714/722 |
| 2007/0214395 | A1 | * | 9/2007 | Shiota et al. .................. 714/47 |
| 2008/0117663 | A1 | * | 5/2008 | Philipp et al. ............... 365/148 |
| 2009/0055680 | A1 | * | 2/2009 | Honda et al. .................... 714/5 |
| 2009/0125671 | A1 | * | 5/2009 | Flynn et al. ................. 711/103 |

FOREIGN PATENT DOCUMENTS

| JP | 8-279295 |   | 10/1996 |
| JP | 08-279295 | * | 10/1996 |
| JP | 2000-235524 |   | 8/2000 |

OTHER PUBLICATIONS

U.S. Appl. No. 12/170,102, filed Jul. 9, 2008, Sugahara.

* cited by examiner

*Primary Examiner*—John P Trimmings
(74) *Attorney, Agent, or Firm*—Oblon, Spivak, McClelland, Maier & Neustadt, L.L.P.

(57) ABSTRACT

When a host system outputs a read command to a memory controller, it measures a load count of a memory area on which a read access load is imposed. Then, when the host system judges that the load count of a memory area reaches a predetermined count, it causes the memory controller to perform an error detection on the memory area. Further, when the host system finds that an error occurs in the memory area, it causes the memory controller to perform an error correction on the memory area. This can avoid or reduce unintended rewriting due to repeated readouts.

24 Claims, 9 Drawing Sheets

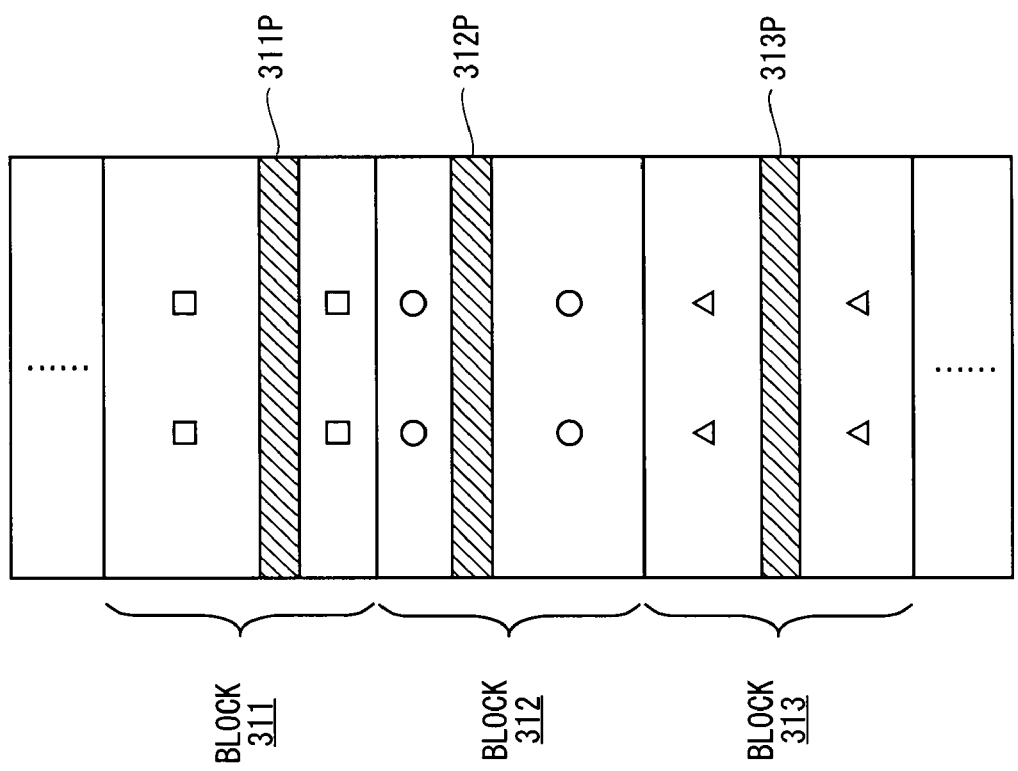

DIFFUSION TABLE 142

| READ BLOCK | RELATED BLOCK |
|---|---|
| BLOCK 322 | BLOCK 321, BLOCK 323 |

LOAD COUNT INFORMATION 132

| BLOCK NAME | LOAD COUNT |
|---|---|
| BLOCK 321 | 1 |
| BLOCK 322 | 2 |
| BLOCK 323 | 1 |

MEMORY ACCESS SYSTEM

BACKGROUND OF THE INVENTION

1 Field of the Invention

The present invention relates to a technique to avoid unintended rewriting of data or reduce the possibility thereof, due to repeated readouts of data from a nonvolatile memory.

2. Description of the Background Art

NAND flash memories, among nonvolatile memories, are heavily used for SD memory cards or the like for the purpose of achieving high integration, reduction in manufacturing cost and easy writing for users by simplifying circuit configurations.

In recent, NAND flash memories are adopted for game machines or the like. When the NAND flash memories are used for game machines, there occurs no write operation but only consecutive read operations. In other words, NAND flash memories have been increasingly adopted as ROMs.

Since specific programs are repeatedly read out in the game machines or the like in most cases, however, it begins to be noticed that the programs could be unintendedly rewritten. Such a phenomenon is termed "read disturb phenomenon", and the mechanism of this phenomenon will be briefly discussed below.

FIG. 8 is a schematic diagram showing an NAND flash memory. The NAND flash memory is constituted of a bit line 41 and word lines 42, 43 and 44 which are arranged in a lattice manner, memory cells 52 and 53, a selection transistor 54 and the like.

In a case where binary data ("0" or "1") stored in the memory cell 52 is read out, the memory cell 52 is a selected cell and the memory cell 53 is an unselected cell. First, the selection transistor 54 specifies the bit line 41 to which the selected cell 52 belongs. Next, a low gate voltage (V(Low) =0V) is applied to the word line 42 to which the selected cell 52 belongs. Then, a high gate voltage (V(High) of approximately 5V) is applied to the word line 43 to which the unselected cell 53 belongs. At that time, since the unselected cell 53 is in a very weak writing condition, electrons are trapped in a floating gate of the unselected cell 53 and accumulated therein. In other words, when binary data stored in the selected cell 52 is repeatedly read out, there is a possibility that a threshold voltage of the unselected cell 53 might be shifted and binary data stored in the unselected cell 53 might be unintendedly rewritten, being changed from "1" to "0".

Even if the binary data stored in the unselected cell 53 is unintendedly rewritten, however, when data are collectively erased before new data are written, it is possible to recover the function of the unselected cell 53. But, if there occurs no write operation and only consecutive read operations, it is impossible to recover the function of the unselected cell 53.

US Patent Application Publication No. 2005/0210184 discloses means for avoiding the above-discussed read disturb phenomenon by controlling the inside of a memory cell. This disclosed method, however, can be applied to a memory having a specific cell configuration but can not be applied to any other cell configuration. In other words, by this method, it is impossible to avoid the read disturb phenomenon without depending on cell configurations of memories.

SUMMARY OF THE INVENTION

The present invention is intended for a memory access system for making read access to a memory.

According to an aspect of the present invention, the memory access system comprises a load count memory part for storing a load count of each memory area on which a read access load is imposed as read access is made to a reading area, an error detection part for performing an error detection on one memory area when the load count of the one memory area reaches a predetermined load count, and an error correction part for performing an error correction on an error detection area when an error is detected in the one memory area.

In this aspect of the present invention, the error detection and the error correction are performed not only on a selected cell associated with a read address but also on an unselected cell other than the selected cell associated with the read address. This avoids or reduces the read disturb phenomenon.

According to another aspect of the present invention, the load count memory part includes a part for clearing the load count of the error detection area after the error correction on the error detection area.

By this aspect of the present invention, it is possible to prevent the error detection from being performed on an error detection area immediately after the error correction is performed on the error detection area. This avoids or reduces the read disturb phenomenon with no burden imposed on the memory access system.

According to still another aspect of the present invention, the memory access system further comprises a part for checking if the load count of each memory area reaches the predetermined load count when a predetermined condition is satisfied.

By this aspect of the present invention, it is possible to prevent frequent error detections. This avoids or reduces the read disturb phenomenon with no burden imposed on the memory access system.

Therefore, it is an object of the present invention to provide means for avoiding or reducing the read disturb phenomenon even in various types of nonvolatile memories without any restriction depending on cell configurations of memories.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 6A and 6B are views showing a manner of counting a load count in a NAND flash memory of the SLC system;

DESCRIPTION OF THE PREFERRED EMBODIMENTS

Constituent Elements of Memory System Of This Preferred Embodiment

Hereinafter, the preferred embodiment of the present invention will be discussed with reference to figures. In the read disturb phenomenon, when data stored in a reading area is repeatedly read out, there is a possibility that data stored in a non-reading area might be unintendedly rewritten. Then, a memory system of this preferred embodiment performs error detection and error correction not only on the reading area but also on the non-reading area in order to avoid the read disturb phenomenon.

If the memory system performs the error detection and the error correction on the reading area and the non-reading area for each read access, however, there is a possibility of causing an overhead of software processing in the memory system. For this reason, the memory system measures the number of loads (load count), which is the number of read access loads imposed on the non-reading area when read access is made to the reading area. Then, on judging that the load count reaches a predetermined count, the memory system performs the error detection and the error correction on the reading area and the non-reading area.

Figure 1:
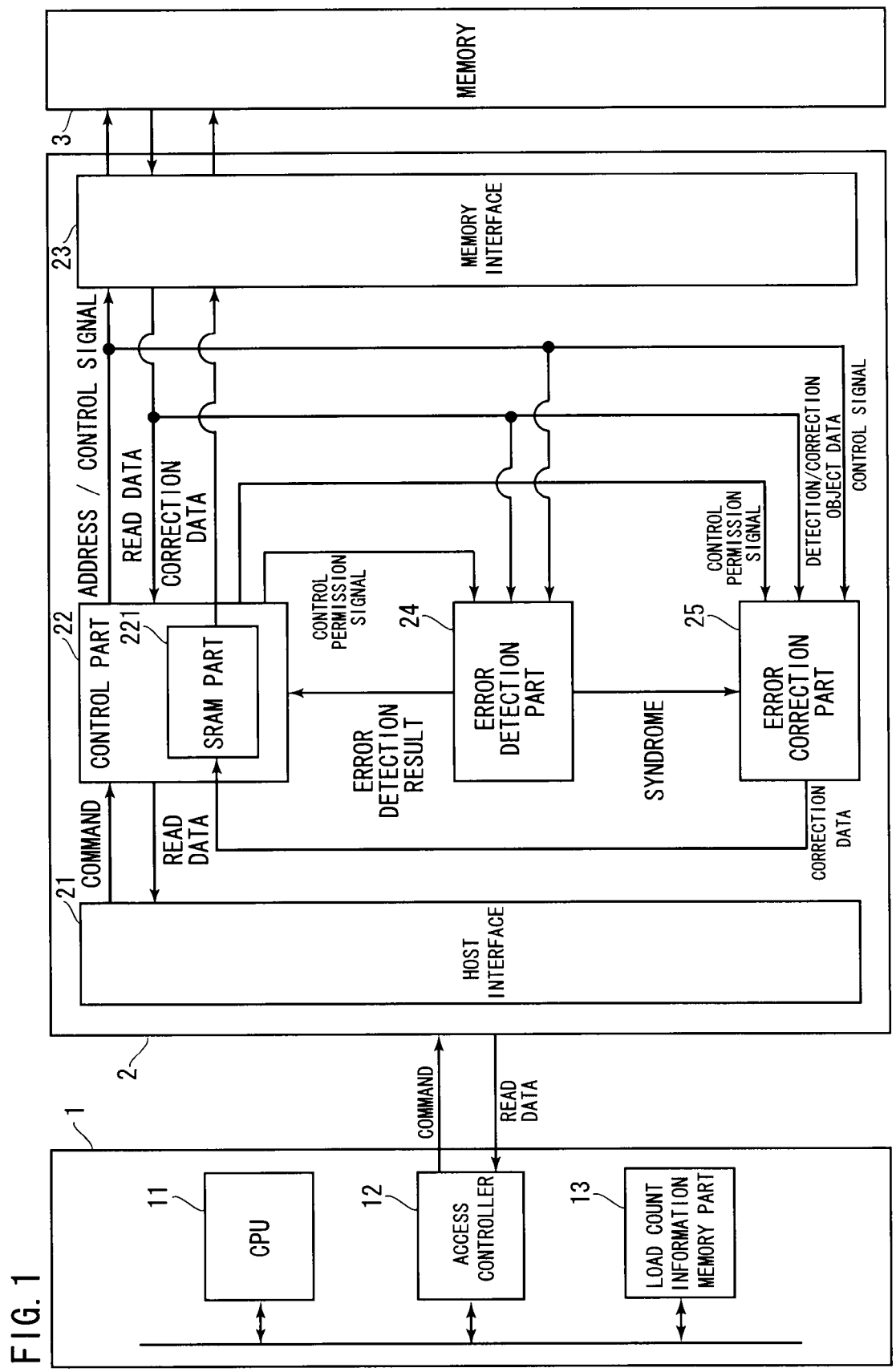
FIG. 1 is a block diagram showing a memory system in accordance with the preferred embodiment of the present invention.

FIG. 1 is a block diagram showing a memory system in accordance with this preferred embodiment. The memory system of this preferred embodiment is, for example, a game device, and consists of a host system 1, a memory controller 2, a memory 3 and the like.

When the host system 1 causes the memory controller 2 to make read access, it determines a memory area on which a read access load is imposed and measures the load count of the memory area. Then, the host system 1 causes the memory controller 2 to perform the error detection on the memory area whose load count reaches the predetermined count and to further perform the error correction on the memory area in which an error is detected.

On receiving a command from the host system 1, the memory controller 2 makes read access to the memory 3 and performs the error detection and the error correction on the memory 3. Though the host system 1 measures the load count in this preferred embodiment, the load count may be measured by the memory controller 2. The case where the memory controller 2 measures the load count will be discussed later as a variation.

The memory 3 stores data to be processed by the host system 1. In this preferred embodiment, a NAND flash memory of the SLC (Single-Level Cell) system or a NAND flash memory of the MLC (Multi-Level Cell) system is used as the memory 3. In the NAND flash memory of the SLC system, one memory cell stores 1-bit data. In the NAND flash memory of the MLC system, one memory cell stores multibit data.

As discussed later in detail referring to FIGS. 6A and 6B and 7A to 7C, in the NAND flash memory of the SLC system, when the host system 1 makes read access to a page, there is a possibility that an error might occur in a block including the page. In the NAND flash memory of the MLC system, when the host system 1 makes read access to a page, there is a possibility that errors might occur not only in the block including the page but also in other blocks.

For this reason, in the NAND flash memory of the SLC system, the load counts are measured not only on a read page but also on the block including the read page. Further, in the NAND flash memory of the MLC system, the load counts are measured not only on a read page but also on the block including the read page and other blocks.

The host system 1 consists of a CPU 11, an access controller 12, a load count information memory part 13 and the like.

The CPU 11 sets a read command to the access controller 12 in order to process data stored in the memory 3. Then, the CPU 11 determines a memory area on which a read access load is imposed and notifies information specifying the memory area to the load count information memory part 13. When the load count of a memory area reaches the predetermined count, the CPU 11 further sets an error detection command and an error correction command to the access controller 12.

On receiving a command issuing instruction from the CPU 11, the access controller 12 outputs the read command, the error detection command and the error correction command to the memory controller 2. Then, the access controller 12 receives the data stored in the memory 3 from the memory controller 2 and outputs the data to the CPU 11.

The load count information memory part 13 receives from the CPU 11 a notice on the information specifying the memory area on which the read access load is imposed. Then, the load count information memory part 13 accumulates the number of notices received from the CPU 11 on the information specifying each memory area and stores the number of notices therein as the load count. On receiving a request from the CPU 11, the load count information memory part 13 further provides the information on the load count to the CPU 11.

The memory controller 2 consists of a host interface 21, a control part 22, a memory interface 23, an error detection part 24, an error correction part 25 and the like.

The host interface 21 is an interface for transmitting commands and data between the host system 1 and the memory controller 2.

The control part 22 receives a command from the host system 1 and controls the memory 3, the error detection part 24 and the error correction part 25. Then, the control part 22 relays the read data from the memory 3 to the host system 1 and relays correction data from the error correction part 25 to the memory 3 through an SRAM part 221.

The memory interface 23 is an interface for transmitting commands and data between the memory controller 2 and the memory 3.

The error detection part 24 is controlled by the control part 22 to perform the error detection on error detection object data. Then, the error detection part 24 notifies the control part 22 whether an error is detected or not.

The error correction part 25 is controlled by the control part 22 to perform the error correction on error correction object data. Then, the error correction part 25 outputs correction data to the SRAM part 221 included in the control part 22.

Operation Flows of This Preferred Embodiment

Next, the operation flows of this preferred embodiment will be discussed in the following order: (1) the reading of read data; (2) the error detection; (3) the error correction; and (4) the writing of error correction data.

Figure 2:
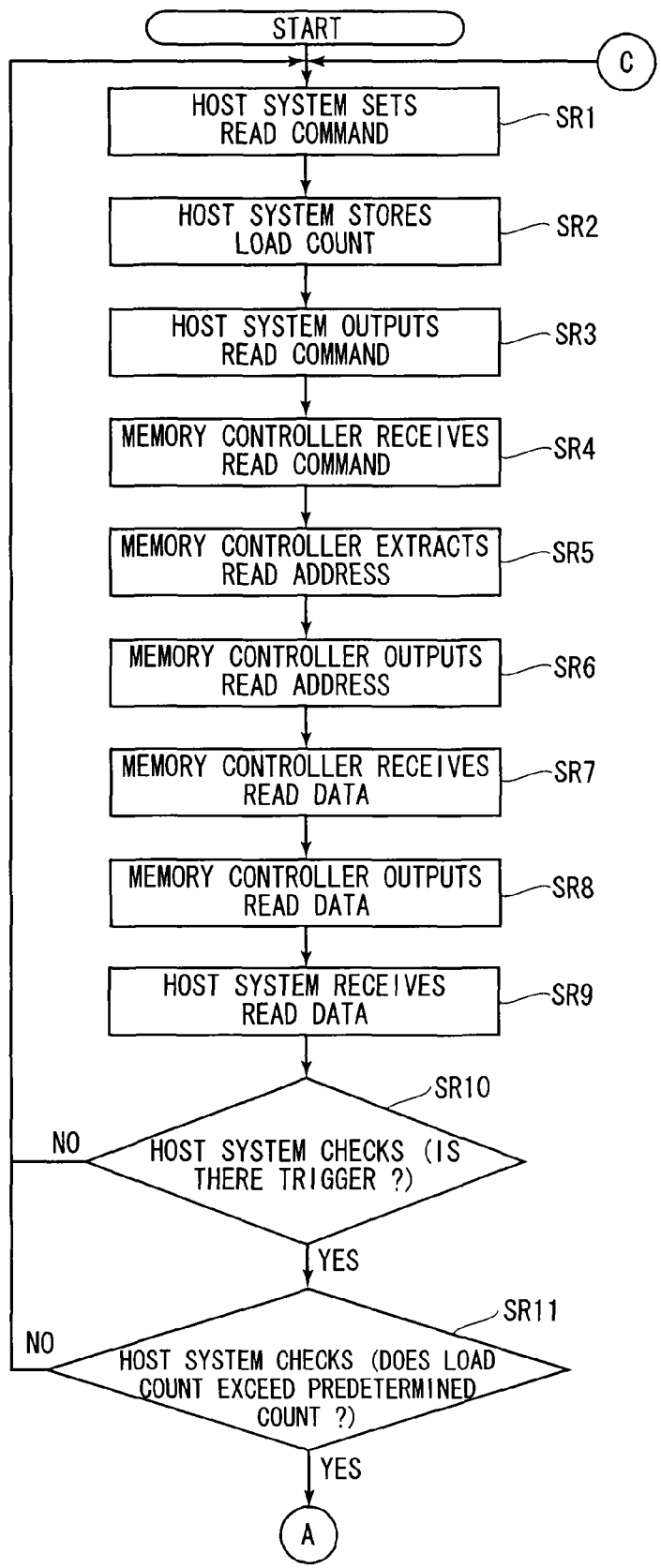
FIG. 2 is a flowchart showing an operation flow for reading of read data.

FIG. 2 is a flowchart showing an operation flow for the reading of read data. "SR" in FIG. 2 represents steps for reading of the read data. The CPU 11 sets a read command to the access controller 12 (Step SR1). Then, the CPU 11 determines a memory area on which a read access load is imposed from a read address included in the read command and notifies information specifying the memory area to the load count information memory part 13. The load count information memory part 13 stores the load count of the memory area (Step SR2).

Herein, referring to FIGS. 6A and 6B and 7A to 7C, discussion will be made on a manner of the CPU 11 for determining a memory area on which a read access load is imposed from the read address included in the read command. First, referring to FIGS. 6A and 6B, discussion will be made on a manner for counting the load count in the NAND flash memory of the SLC system. Next, referring to FIGS. 7A to 7C, discussion will be made on a manner for counting the load count in the NAND flash memory of the MLC system. The present invention, however, can be applied to nonvolatile memories which have a possibility that when data stored in a reading area is repeatedly read out, data stored in a non-reading area might be unintendedly rewritten.

FIG. 6A is a schematic view showing a memory cell array 31 of the NAND flash memory of the SLC system. The memory cell array 31 is constituted of a plurality of blocks. FIG. 6A shows three blocks 311, 312 and 313. Further, each block is constituted of a plurality of pages. In FIG. 6A, pages 311P, 312P and 313P in the blocks 311, 312 and 313, respectively, are hatched.

When the host system 1 makes read access to the page 311P, unselected cells included in pages of the block 311 other than the page 311P are in a very weak writing condition. In other words, there is a possibility that the read disturb phenomenon might occur in pages of the block 311 other than the page 311P. The manner in which the read disturb phenomenon occurs in the block 311 is schematically represented by square (□).

When the host system 1 makes read access to the pages 312P and 313P, there is a possibility that the read disturb phenomenon might occur in respective pages of the blocks 312 and 313 other than the pages 312P and 313P. The manner in which the read disturb phenomenon occurs in the blocks 312 and 313 is schematically represented by circle (○) and triangle (Δ), respectively.

FIG. 6B is a conceptual diagram showing the load count information 131. In order to read data out from the page 311P, the CPU 11 sets a read command associated with the page 311P to the access controller 12 (Step SR1). At this time, the CPU 11 judges that there is a possibility that the read disturb phenomenon might occur in the block 311 including the page 311P. For this reason, the CPU 11 counts by 1 as the load count indicating the number of the read access loads imposed on the block 311 (Step SR2).

On reading data in the pages 312P and 313P, the CPU 11 counts by 1 as the load counts indicating the respective numbers of read access loads imposed on the blocks 312 and 313 including the pages 312P and 313P (Step SR2). In the load count information 131 of FIG. 6B, the state where each of the load counts of the blocks 311, 312 and 313 is counted as 1 is schematically shown. When the CPU 11 further reads data out from the pages 311P, 312P and 313P, the respective load counts of the blocks 311, 312 and 313 are further counted by 1.

Figures 7A, 7B, 7C:
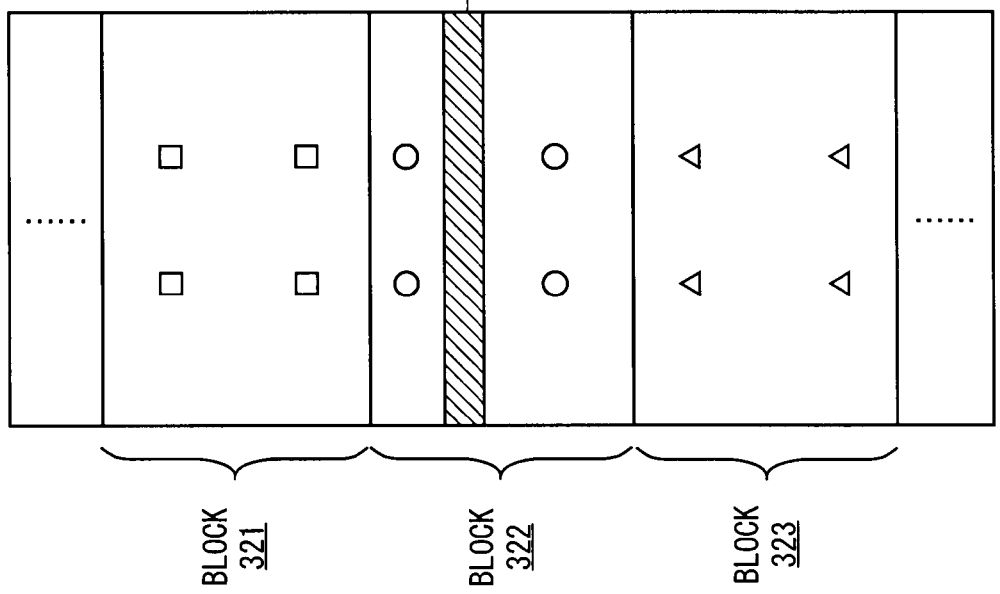
FIGS. 7A to 7C are views showing a manner of counting a load count in a NAND flash memory of the MLC system.
Figure 8:
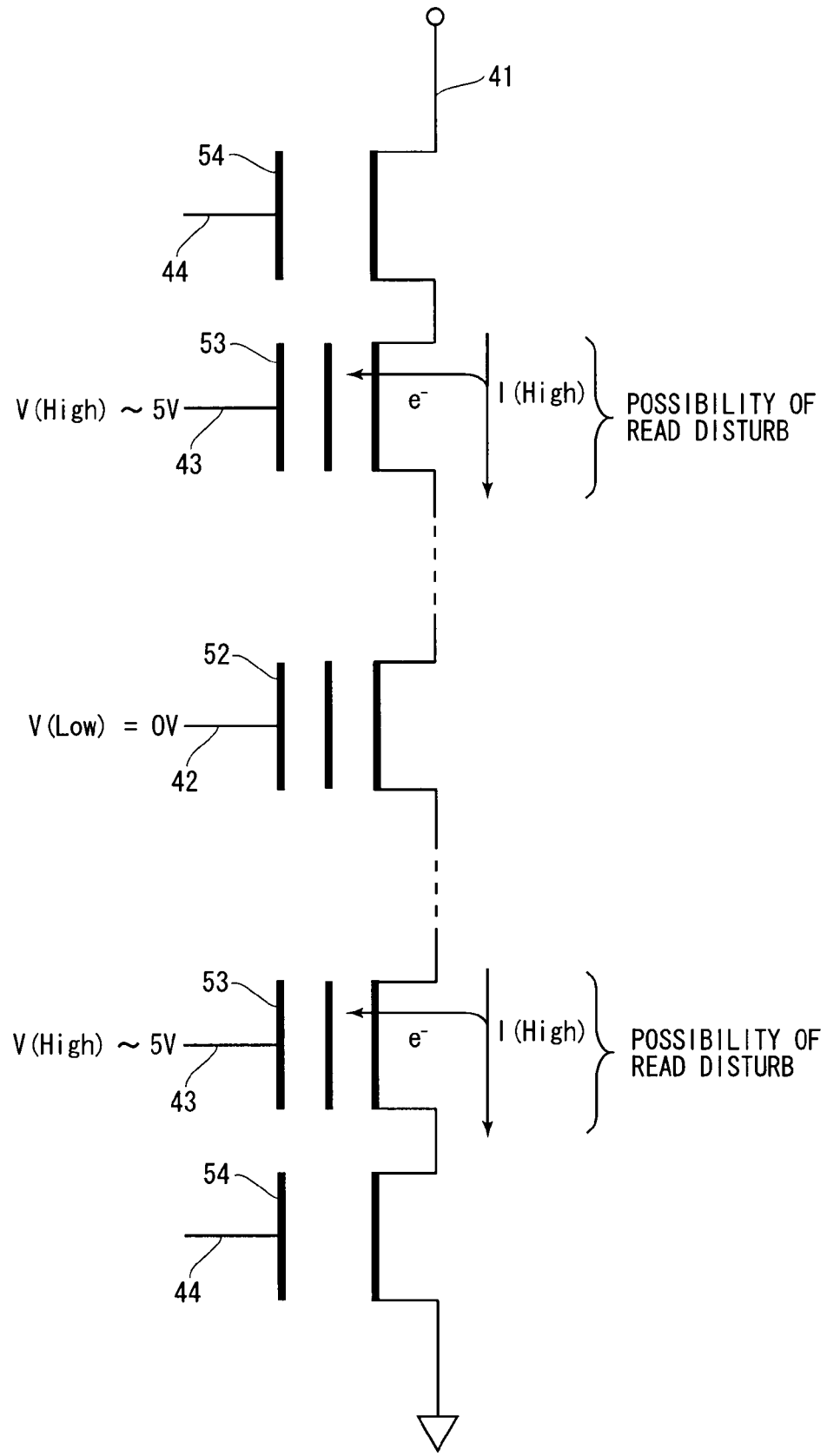
FIG. 8 is a schematic view of a NAND flash memory.

FIG. 7A is a schematic view showing a memory cell array 32 of the NAND flash memory of the MLC system. The memory cell array 32 is constituted of a plurality of blocks. FIG. 7A shows three blocks 321, 322 and 323. Further, each block is constituted of a plurality of pages. In FIG. 7A, a page 322P in the block 322 is hatched.

When the host system 1 makes read access to the page 322P, there is a possibility that the read disturb phenomenon might occur in pages of the block 322 other than the page 322P and related blocks to which the read disturb phenomenon might diffuse from the block 322. In FIG. 7A, the blocks 321 and 323 are shown as the related blocks to which the read disturb phenomenon might diffuse from the block 322. The manner in which the read disturb phenomenon occurs in the blocks 321, 322 and 323 is schematically represented by square (□), circle (○) and triangle (Δ), respectively.

FIG. 7B is a conceptual diagram showing a diffusion table 142. The diffusion table 142 indicates that there is a possibility that the read disturb phenomenon might diffuse to the related blocks other than the read block. As discussed referring to FIG. 7A, when the read block is the block 322, there is a possibility that the read disturb phenomenon might occur not only in the block 322 but also in the blocks 321 and 323. The diffusion table 142 may be stored in a ROM included in the host system 1.

FIG. 7C is a conceptual diagram showing the load count information 132. In order to read data out from the page 322P, the CPU 11 sets a read command associated with the page 322P to the access controller 12 (Step SR1). At this time, the CPU 11 judges, by referring to the diffusion table 142, that there is a possibility that the read disturb phenomenon might occur in the block 322 including the page 322P and the blocks 321 and 323. For this reason, the CPU 11 counts the load counts indicating the respective numbers of the read access loads imposed on the blocks 321, 322 and 323 (Step SR2).

Herein, discussion will be made on a method of counting the load count indicating the number of read access loads imposed on a specific block. With respect to one read block, there are a number of related blocks. If the respective load counts of the read block and its related blocks are counted with the same weight, the respective load counts increase at the same speed toward the predetermined count which serves as a trigger for the error detection. For this reason, the host system 1 sometimes has a need to cause the memory controller 2 to perform the error detection on one read block and a number of its related blocks at a time.

The read access load on the related block, however, is usually lighter than the read access load on the read block. For this reason, the load count of the read block may be counted with a heavier weight and the load count of the related block may be counted with a lighter weight. As schematically shown in the load count information 132 of FIG. 7C, for example, when the CPU 11 reads data out from the page 322P, the load count of the read block 322 is virtually counted by 2 and the load counts of the related blocks 321 and 323 are counted by 1 as usual.

In the NAND flash memories of the SLC system and the MLC system, an appropriate count may be determined as the predetermined count which the load count should reach for the error detection. In a memory which is less susceptible to the read disturb phenomenon, for example, the predetermined count may be determined to be a large number. In this case, since the error detection is not frequently performed, the host system 1 has less error detection load. On the other hand, in a memory which is more susceptible to the read disturb phenomenon, the predetermined count may be determined to be a small number. In this case, since the error detection is frequently performed, it is possible to avoid the read disturb phenomenon beforehand.

The load count information memory part 13 may be a nonvolatile memory or a volatile memory. If the load count information memory part 13 is a nonvolatile memory, even when the power supply of the memory system is turned off, the load count information is kept, and when the power supply is turned on next, the load count information can be effectively used. If the load count information memory part 13 is a volatile memory, the load count information can be effectively used from when the power supply of the memory system is turned on to when the power supply is turned off.

Discussion will be made again on the operation flow shown in FIG. 2. The CPU 11 outputs an issuing instruction of the read command to the access controller 12 (Step SR3). The control part 22 receives the read command from the host system 1 through the host interface 21 (Step SR4). Then, the control part 22 decodes the read command and extracts the read address (Step SR5). The control part 22 further outputs the read address to the memory 3 through the memory interface 23 (Step SR6).

The control part 22 receives read data from the memory 3 through the memory interface 23 (Step SR7). Then, the control part 22 outputs the read data to the host system 1 through the host interface 21 (Step SR8). The CPU 11 receives the read data from the access controller 12 and processes the read data (Step SR9).

The CPU 11 checks if there is any trigger (Step SR10) before it sets a new read command to the access controller 12 (Step SR1). Then, if the CPU 11 finds that there is any trigger ("YES" in Step SR10), it takes the load count information out from the load count information memory part 13 (Step SR11). Further, if the CPU 11 finds that there is no trigger ("NO" in Step SR10), it sets a new read command to the access controller 12 (Step SR1).

As the trigger that the CPU 11 checks if there is, triggers discussed below can be adopted. First, that the number of read accesses made by the host system 1 regardless of the read address reaches a predetermined count serves as a trigger. Next, that the time which a timer measures reaches a predetermined time serves as another trigger. Further, that the power supply of the memory system is turned off serves as still another trigger. If the above triggers are used, the CPU 11 does not take the load count information every when it makes read access. Every when the CPU 11 makes read access, however, it may take the load count information.

Figure 3:
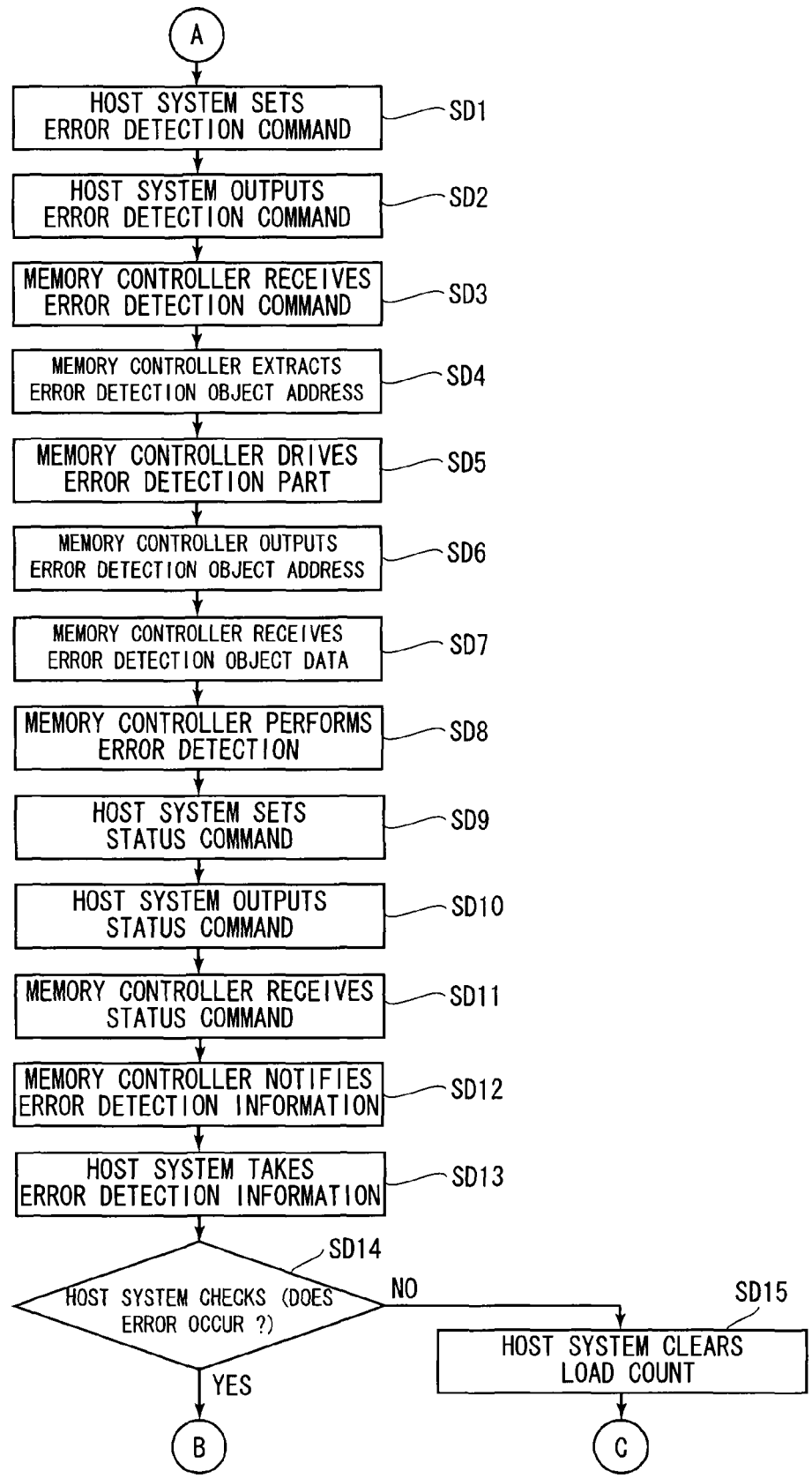
FIG. 3 is a flowchart showing an operation flow for error detection.

When the CPU 11 takes the load count information, if the load count of one block exceeds the predetermined count ("YES" in Step SR11), the CPU 11 causes the memory controller 2 to perform the error detection on the block ("A" in FIGS. 2 and 3). When the CPU 11 takes the load count information, if the load count of each block does not exceed the predetermined count ("NO" in Step SR11), the CPU 11 sets a new read command to the access controller 12 (Step SR1).

FIG. 3 is a flowchart showing an operation flow for the error detection. "SD" in FIG. 3 represents steps for the error detection. The CPU 11 sets an error detection command to the access controller 12 (Step SD1). Then, the CPU 11 outputs an issuing instruction of the error detection command to the access controller 12 (Step SD2).

The control part 22 receives the error detection command from the host system 1 through the host interface 21 (Step SD3). Then, the control part 22 decodes the error detection command and extracts an error detection object address (Step SD4). The control part 22 also outputs a control permission signal to the error detection part 24, to thereby cause the error detection part 24 to start operating (Step SD5). Further, the control part 22 outputs the error detection object address to the memory 3 through the memory interface 23 (Step SD6).

The error detection part 24 receives error detection object data from the memory 3 through the memory interface 23 (Step SD7). Then, the error detection part 24 performs the error detection on the error detection object data and notifies an error detection result to the control part 22 (Step SD8). The error detection part 24 further holds a syndrome generated during the error detection and prepares for a subsequent error correction.

The host system 1 can take error detection information out from the memory controller 2. The error detection information refers to information indicating whether the error detection is completed or not, and if the error detection is completed, it refers to information indicating whether there occurs any error or not, or the like.

The CPU 11 sets a status command to the access controller 12 (Step SD9). Then, the CPU 11 outputs an issuing instruction of the status command to the access controller 12 (Step SD10). The control part 22 receives the status command from the host system 1 through the host interface 21 (Step SD11). Then, the control part 22 notifies the error detection information to the host system 1 through the host interface 21 (Step SD12). The CPU 11 takes the error detection information out from the access controller 12 (Step SD13).

Figure 4:
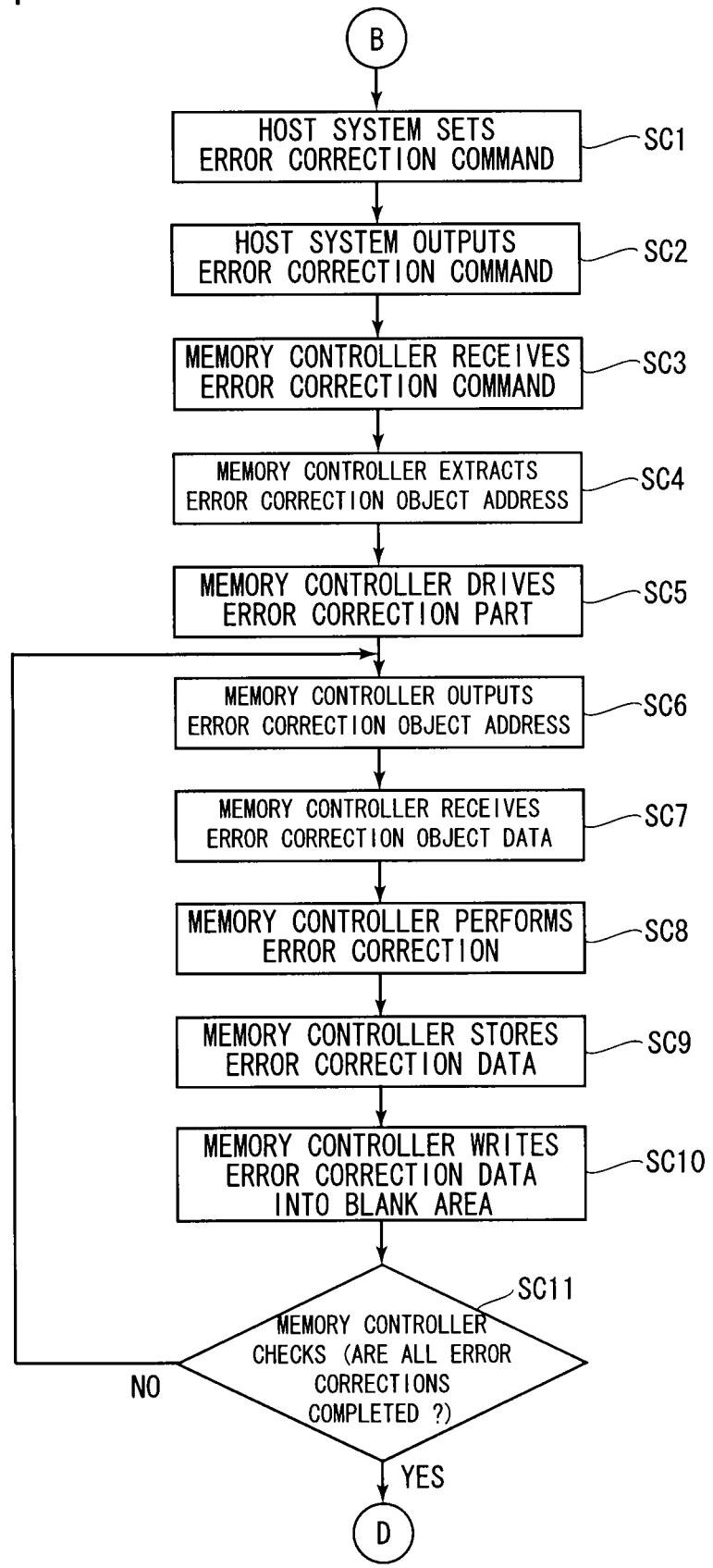
FIG. 4 is a flowchart showing an operation flow for error correction.

If the CPU 11 finds that an error occurs on the error detection object address ("YES" in Step SD14), it causes the memory controller 2 to perform the error correction on the address ("B" in FIGS. 3 and 4). If the CPU 11 finds that no error occurs on the error detection object address ("NO" in Step SD14), it clears the load count on the address, which is stored in the load count information memory part 13 (Step SD15). In other words, when the load count on the address reaches the predetermined count again, the error detection is performed on the address again. Then, the CPU 11 sets a new read command to the access controller 12 ("C" in FIGS. 2 and 3).

FIG. 4 is a flowchart showing an operation flow for the error correction. "SC" in FIG. 4 represents steps for the error correction. The CPU 11 sets an error correction command to the access controller 12 (Step SC1). Then, the CPU 11 outputs an issuing instruction of the error correction command to the access controller 12 (Step SC2).

The control part 22 receives the error correction command from the host system 1 through the host interface 21 (Step SC3). Then, the control part 22 decodes the error correction command and extracts an error correction object address (Step SC4). The control part 22 also outputs a control permission signal to the error correction part 25, to thereby cause the error correction part 25 to start operating (Step SC5). At this time, the control part 22 outputs a control non-permission signal to the error detection part 24, to thereby cause the error detection part 24 to stop operating. This can avoid a change of the syndrome generated in Step SD8 due to the simultaneous operations of the error detection part 24 and the error correction part 25. Further, the control part 22 outputs the error correction object address to the memory 3 through the memory interface 23 (Step SC6).

The error correction part 25 receives error correction object data from the memory 3 through the memory interface 23 (Step SC7). Then, the error correction part 25 performs the error correction on the error correction object data in accordance with the syndrome generated in Step SD8 (Step SC8) and stores correction data into the SRAM part 221 (Step SC9). The control part 22 writes the correction data stored in the SRAM part 221 into a blank area of the memory 3 through the memory interface 23 (Step SC10).

Figure 5:
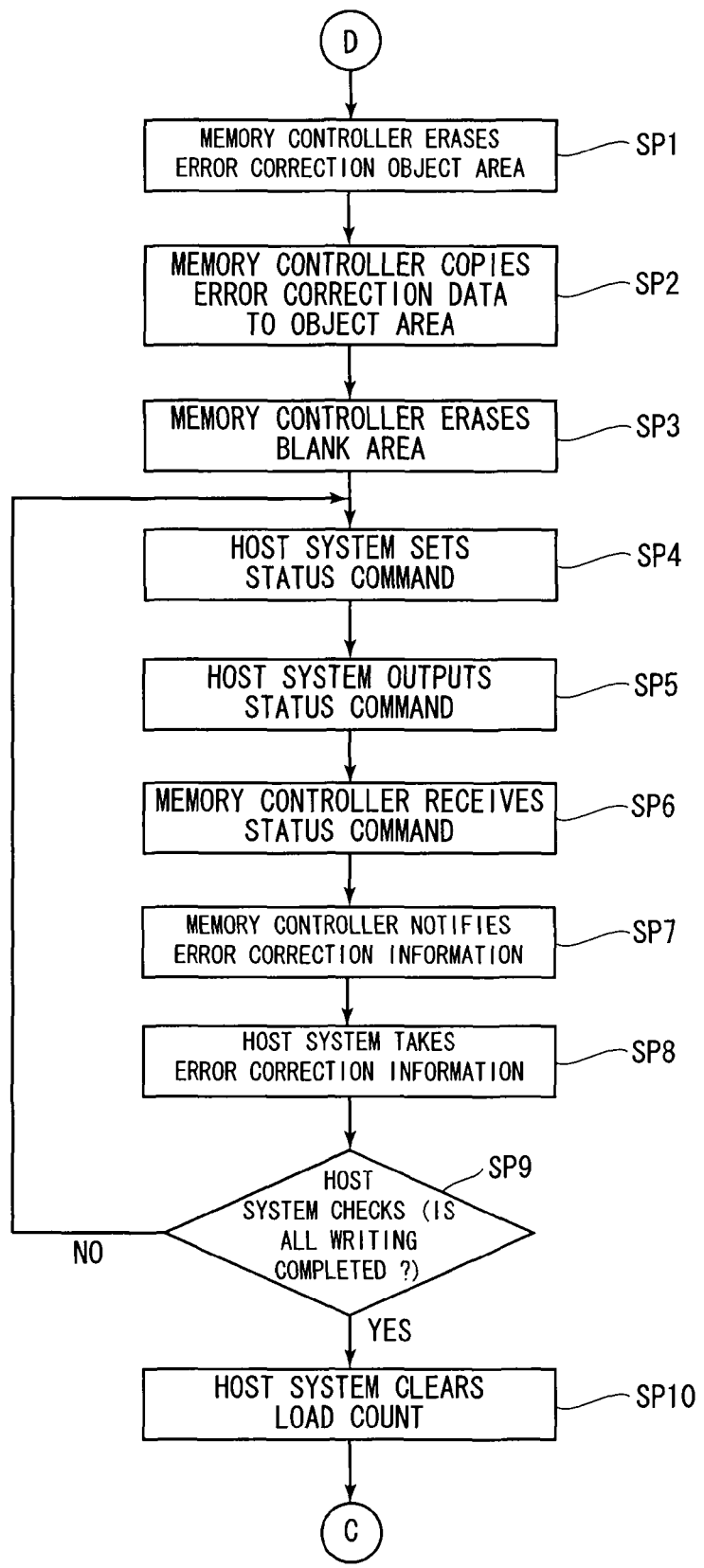
FIG. 5 is a flowchart showing an operation flow for writing of error correction data.

If the control part 22 finds that the error correction is completed ("YES" in Step SC11), it erases data of the error correction object address ("D" in FIGS. 4 and 5). If the control part 22 finds that the error correction is not completed ("NO" in Step SC11), it outputs a new error correction object address in which the error correction is not finished to the memory 3 (Step SC6).

FIG. 5 is a flowchart showing an operation flow for the writing of error correction data. "SP" in FIG. 5 represents steps for writing of the error correction data. The control part 22 erases data of the error correction object address (Step SP1). Then, the control part 22 copies the correction data written in the blank area of the memory 3 to an area of the error correction object address (Step SP2). Further, the control part 22 erases the correction data written in the blank area of the memory 3 (Step SP3).

In this case, the control part 22 may not perform Steps SP1 to SP3. In other words, the control part 22 has only to write the correction data stored in the SRAM part 221 into the blank area of the memory 3 (Step SC10). At this time, the control part 22 has to have memory management information, or the like. The memory management information refers to information indicating that the correction data is written in the blank area not in the original storage area.

The host system 1 can take error correction information out from the memory controller 2. The error correction information refers to information indicating whether writing of the correction data is completed or not, or the like.

The CPU 11 sets the status command to the access controller 12 (Step SP4). Then, the CPU 11 outputs an issuing instruction of the status command to the access controller 12 (Step SP5). The control part 22 receives the status command from the host system 1 through the host interface 21 (Step SP6). Then, the control part 22 notifies the error correction information to the host system 1 through the host interface 21 (Step SP7). The CPU 11 takes the error correction information out from the access controller 12 (Step SP8).

If the CPU 11 finds that writing of the correction data is completed ("YES" in Step SP9), it clears the load count on the error correction object address, which is stored in the load count information memory part 13 (Step SP10). Then, the CPU 11 sets a new read command to the access controller 12 ("C" in FIGS. 2 and 5). If the CPU 11 finds that writing of the correction data is not completed ("NO" in Step SP9), it sets the status command to the access controller 12 again (Step SP4).

The operation flows discussed referring to FIGS. 2 to 5 are repeated until the power supply of the memory system is turned off. There is a possibility of causing the read disturb phenomenon in a block during the read access to the read address. When the load count of the block exceeds the predetermined count, the error detection is performed on the block. Then, when an error is detected, the error correction is performed on the block.

In other words, not only on the read address but also on the block which has a possibility of causing the read disturb phenomenon, the error detection and the error correction are performed. Therefore, the memory system of this preferred embodiment can avoid or reduce the read disturb phenomenon.

<Variation where Memory Controller Measures Load Count>

Figure 9:
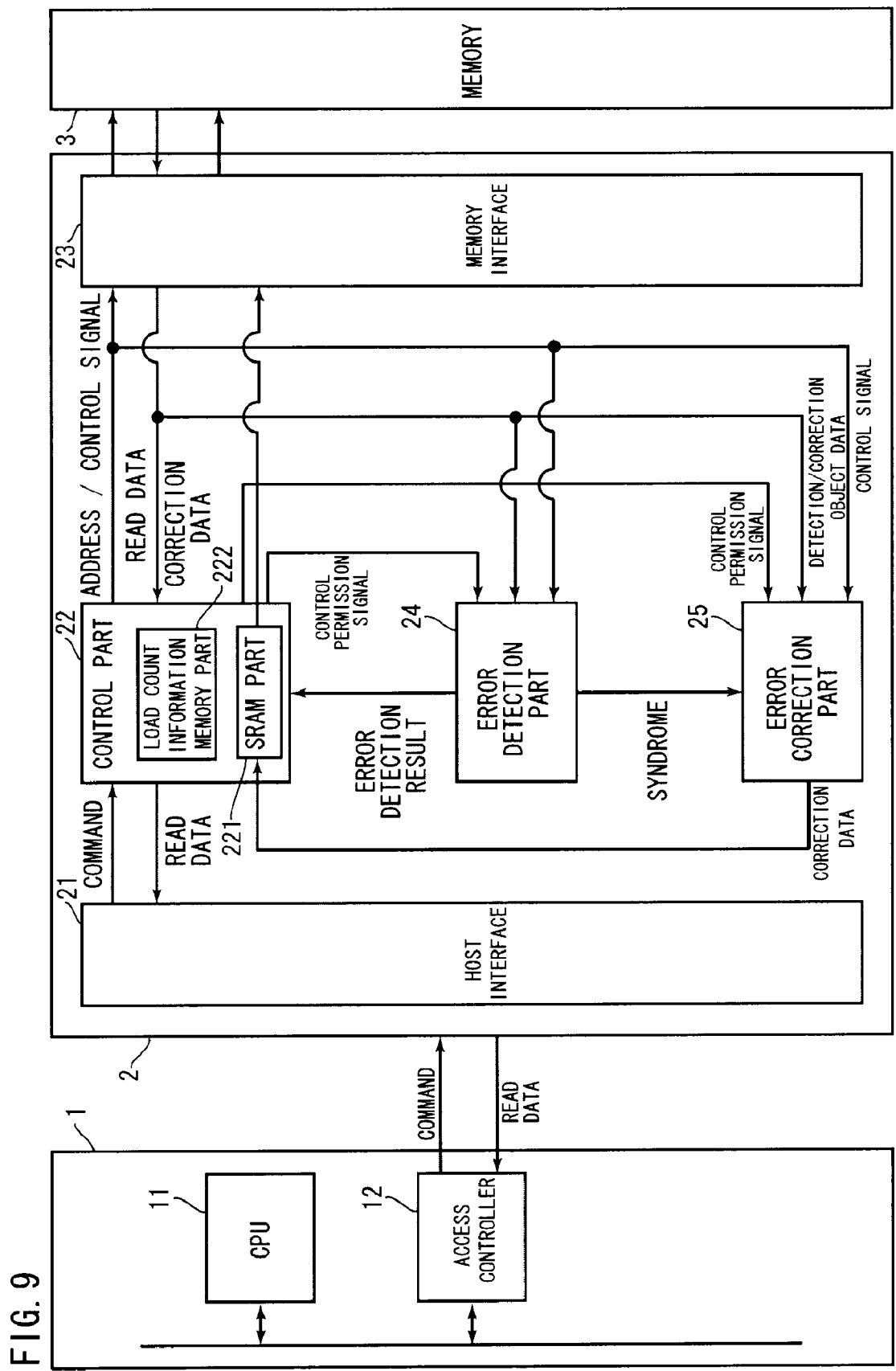
FIG. 9 is a block diagram showing a memory system in accordance with an embodiment of the present invention.

In the above preferred embodiment, the host system 1 comprises the load count information memory part 13. In contrast, in this variation, depicted in FIG. 9, the memory controller 2 comprises the load count information memory part 222. In other words, since the host system 1 does not judge on the load count, the load of the host system 1 is reduced.

When the host system 1 outputs a read command to the memory controller 2, the load count information memory part determines a memory area which has a possibility of causing the read disturb phenomenon. Then, the error detection is performed on the memory area and if an error is detected, the error correction is performed on the memory area.

Also in this variation, the host system 1 outputs an error detection command and an error correction command to the memory controller 2. Therefore, the host system 1 checks the status of process in the memory controller 2. For example, the host system 1 has only to output the status command to the memory controller 2. Further, the memory controller 2 has only to notify the status of processing the error detection and the error correction to the host system 1.

While the invention has been shown and described in detail, the foregoing description is in all aspects illustrative and not restrictive. It is therefore understood that numerous modifications and variations can be devised without departing from the scope of the invention.

What is claimed is:

1. A memory access system for making read access to a memory, comprising:
   a load count memory unit configured to store a load count of each memory area on which a read access load is imposed as read access is made to a reading area;
   an error detection unit configured to perform an error detection on one memory area when the load count of said one memory area reaches a predetermined load count; and
   an error correction unit configured to perform an error correction on said one memory area when an error is detected in said one memory area.

2. The memory access system according to claim 1, wherein
   said load count memory unit includes
   a load count clearing unit configured to clear the load count of said one memory area after the error correction on said one memory area.

3. The memory access system according to claim 1, further comprising:
   a load count checking unit configured to check if the load count of each memory area has reached said predetermined load count when a predetermined condition is satisfied.

4. The memory access system according to claim 3, wherein
   said predetermined condition includes
   a condition that a read access count of said memory reaches a predetermined access count.

5. The memory access system according to claim 3, wherein
   said predetermined condition includes
   a condition that the time measured by a timer reaches a predetermined time.

6. The memory access system according to claim 3, wherein
   said predetermined condition includes
   a condition that a power supply is turned off.

7. The memory access system according to claim 1, wherein
   said error correction unit includes
   a data erasing unit configured to erase data detected by the error detection unit as having an error from said one memory area before the error correction; and
   a data writing unit configured to write correction data into said one memory area after the error correction.

8. The memory access system according to claim 1, wherein
   said error correction unit includes
   a data writing unit configured to write correction data into a blank area after the error correction; and an information generating unit configured to generate information indicating that said correction data is written in said blank area and is not written in said one memory area after the error correction.

9. A memory access system, comprising:
a memory controller configured to control read access to a memory; and
a host system configured to output a read command to said memory controller,
wherein said host system comprises
a load count memory unit configured to store a load count of each memory area on which a read access load is imposed as read access is made to a reading area, and
said memory controller comprises
an error detection unit configured to perform an error detection on one memory area when the load count of said one memory area reaches a predetermined load count; and
an error correction unit configured to perform an error correction on said one memory area when an error is detected in said one memory area.

10. The memory access system according to claim 9, wherein
said load count memory unit includes
a load count clearing unit configured to clear the load count of said one memory area after the error correction on said one memory area.

11. The memory access system according to claim 9, further comprising:
a load count checking unit configured to check if the load count of each memory area has reached said predetermined load count when a predetermined condition is satisfied.

12. The memory access system according to claim 11, wherein
said predetermined condition includes
a condition that a read access count of said memory reaches a predetermined access count.

13. The memory access system according to claim 11, wherein
said predetermined condition includes
a condition that the time measured by a timer reaches a predetermined time.

14. The memory access system according to claim 11, wherein
said predetermined condition includes
a condition that a power supply is turned off.

15. The memory access system according to claim 9, wherein
said error correction unit includes
a data erasing unit configured to erase data detected by the error detection unit as having an error from said one memory area before the error correction; and
a data writing unit configured to write correction data into said one memory area after the error correction.

16. The memory access system according to claim 9, wherein
said error correction unit includes
a data writing unit configured to write correction data into a blank area after the error correction; and
an information generating unit configured to generate information indicating that said correction data is written in said blank area and is not written in said one memory area after the error correction.

17. A memory access system, comprising:
a memory controller configured to control read access to a memory; and
a host system configured to output a read command to said memory controller,
wherein said memory controller comprises
a load count memory unit configured to store a load count of each memory area on which a read access load is imposed as read access is made to a reading area;
an error detection unit configured to perform an error detection on one memory area when the load count of said one memory area reaches a predetermined load count; and
an error correction unit configured to perform an error correction on said one memory area when an error is detected in said one memory area.

18. The memory access system according to claim 17, wherein
said load count memory unit includes
a load count clearing unit configured to clear the load count of said one memory area after the error correction on said one memory area.

19. The memory access system according to claim 17, further comprising:
a load count checking unit configured to check if the load count of each memory area has reached said predetermined load count when a predetermined condition is satisfied.

20. The memory access system according to claim 19, wherein
said predetermined condition includes
a condition that a read access count of said memory reaches a predetermined access count.

21. The memory access system according to claim 19, wherein
said predetermined condition includes
a condition that the time measured by a timer reaches a predetermined time.

22. The memory access system according to claim 19, wherein
said predetermined condition includes
a condition that a power supply is turned off.

23. The memory access system according to claim 17, wherein
said error correction unit includes
a data erasing unit configured to erase data detected by the error detection unit as having an error from said one memory area before the error correction; and
a data writing unit configured to write correction data into said one memory area after the error correction.

24. The memory access system according to claim 10, wherein
said error correction unit includes
a data writing unit configured to write correction data into a blank area after the error correction; and
an information generating unit configured to generate information indicating that said correction data is written in said blank area and is not written in said one memory area after the error correction.

* * * * *